United States Patent
Sabey

(12) 
(10) Patent No.: US 6,734,681 B2
(45) Date of Patent: May 11, 2004

(54) APPARATUS AND METHODS FOR TESTING CIRCUIT BOARDS

(76) Inventor: James Sabey, 146 Barberry Pl., Loveland, CO (US) 80537

( * ) Notice: Subject to any disclaimer, the term of this patent is extended or adjusted under 35 U.S.C. 154(b) by 74 days.

(21) Appl. No.: 09/927,903

(22) Filed: Aug. 10, 2001

(65) Prior Publication Data

US 2003/0030459 A1 Feb. 13, 2003

(51) Int. Cl.$^7$ ............................................... G01R 31/02
(52) U.S. Cl. ......................................... 324/528; 324/538
(58) Field of Search ............................... 324/537, 538, 324/527, 528, 529, 530, 523, 671, 158.1, 765

(56) References Cited

U.S. PATENT DOCUMENTS

| | | | |
|---|---|---|---|
| 4,138,643 A | 2/1979 | Beck et al. | 324/73 |
| 4,362,991 A * | 12/1982 | Carbine | 324/754 |
| 4,565,966 A | 1/1986 | Burr et al. | 324/73 |
| 4,675,600 A | 6/1987 | Gergin | 324/158 |
| 4,829,238 A | 5/1989 | Goulette et al. | 324/95 |
| 5,113,133 A | 5/1992 | Conti et al. | 324/158 |
| 5,124,660 A | 6/1992 | Cilingiroglu | 324/538 |
| 5,218,294 A | 6/1993 | Soiferman | 324/158 |
| 5,268,645 A | 12/1993 | Prokoff et al. | 324/537 |
| 5,345,170 A * | 9/1994 | Schwindt et al. | 324/158.1 |
| 5,404,110 A * | 4/1995 | Golladay | 324/501 |
| 5,473,254 A | 12/1995 | Asar | 324/537 |
| 5,557,209 A * | 9/1996 | Crook et al. | 324/538 |
| 5,578,930 A * | 11/1996 | Sheen | 324/530 |
| 5,744,964 A | 4/1998 | Sudo et al. | |
| 5,818,246 A | 10/1998 | Zhong | 324/754 |

FOREIGN PATENT DOCUMENTS

| | | |
|---|---|---|
| EP | 0859239 A2 | 8/1998 |
| GB | 2307754 A | 6/1997 |
| GB | 2353399 A | 2/2001 |

* cited by examiner

*Primary Examiner*—Ernest Karlsen
(74) *Attorney, Agent, or Firm*—Macheledt Bales LLP; Jennifer L. Bales

(57) ABSTRACT

Methods and apparatus are disclosed for detecting manufacturing defects on unpopulated printed circuit boards under test (BUT) utilizing reliable single point current measurement. In a first set of preferred embodiments, an AC signal generator is connected to a signal plate placed under the BUT for applying an electrical field and thereby generating signals in conductors of the BUT. An array of pins mounted on an assembly on top of the BUT at fixed intervals samples currents from the test points on the BUT. In a second set of preferred embodiments, the AC signal generator is connected to the pin array, and the pins apply test signals into the conductive elements of the BUT at fixed intervals. The signal plate detects the electrical field on the BUT. The detected signals are analyzed to discern board faults.

7 Claims, 10 Drawing Sheets

APPARATUS AND METHODS FOR TESTING CIRCUIT BOARDS

FIELD OF THE INVENTION

This application relates generally to electronic test equipment and more specifically to equipment for testing unpopulated printed circuit boards for manufacturing defects utilizing reliable single point current measurement.

BACKGROUND OF THE INVENTION

During the manufacture and subsequent handling of printed circuit boards, defects such as unwanted open circuits or short circuits may develop in or between circuit pathways. Manufacturers continually look for faster, more accurate and more economical ways to find defects. It is necessary and cost effective to perform automated testing of unpopulated printed circuit boards for manufacturing quality control.

Testing of printed circuit boards is becoming increasingly difficult and more expensive as integrated circuits and printed circuit boards become more complex. Conventional techniques for automated printed circuit board testing involve applying signals through a set of test pins and measuring output signals on other test pins. A printed circuit board may be tested on a "bed-of-nails" tester that comprises pins contacting the metallic traces on the printed circuit board being tested so that selected input signals may be applied at various nodes on the printed circuit board, and corresponding output signals can be measured to other nodes on the printed circuit board.

Moving probes are used to test complex high density boards. Most of the moving probe testers utilize a limited number of probes, up to 16 independent probes at this time, to perform continuity and short tests. Like in the "bed-of-nails", the moving probes are pins, which contact the metallic traces on the printed circuit board being tested so that selected input signals may be applied at various nodes on the printed circuit board, and corresponding output signals can be measured to other nodes on the printed circuit board. The moving probe testers offer flexibility, low cost and fixtureless set up. The prime deficiency of the moving probe system is it's slow test time. This deficiency restricts the use of this tester to prototype testing and the testing of very small production runs.

Moving grid testers are also used to test complex high density boards. The moving grid tester utilizes several small moving structures containing probes in close proximity. The objective of this configuration is to improve the test speed of the system over moving probe systems. The prime deficiencies of the moving grid system are its dependency on board configuration for test speed improvement and a lack of reliable single point measurement. These deficiencies severely negate any time improvement over the moving probe systems and moving grid testers are primarily used for prototype and small production runs testing.

Capacitive testing is offered as an option on moving probes and grid testers by measuring the discharge time or charge up time of electrically charged nets and net segments. The deficiency with this method is it limited resolution and comparatively long measurements time.

One printed circuit board testing method is described in U.S. Pat. No. 5,218,294, issued Jun. 8, 1993 to Soiferman. The technique taught away from using a bed-of-nails tester. The patent disclosed stimulating a printed circuit board through the power and ground lines of the board with an AC signal and then contactlessly measuring the electromagnetic near field distribution proximate the board being tested. The electromagnetic "signature" of the board being tested was compared to the electromagnetic signature of a known good circuit board to determine whether the board under test was defective.

One alternative printed circuit board testing method is described in U.S. Pat. No. 4,583,042, issued Apr. 15, 1986 to Riemer. That patent disclosed a circuit board test system for measuring the electrical continuity and integrity of line segments. The system consists of a capacitance meter with a pair of sensory terminals, one of which is coupled to a conductive elastomeric backside reference plane and the other is coupled to a test probe. The test probe is a single shielded one-point probe. The sensors measure voltage levels and from the voltage drop between the sensors, the line segment capacitance is determined. The test probe sensor moves relative to the test board for sequentially contacting all of the test points on the printed circuit board.

A deficiency in the Riemer system is the dependence on the board layout, because the location of the test points must be determined prior to probing. Furthermore, it is critical for accurate measurements that the interface between the test board and reference plane be devoid of air gaps.

Thus, there is a need in the art for a device and method that will detect manufacturing faults on unpopulated printed circuit boards independent of board complexity or net segment size. There is a further requirement in the art to test any printed circuit board in an industry acceptable time. There is still a further need in the art for a system with no need for fixturing specific to the test board, and where the printed circuit board is tested independent of its structure and functionality.

SUMMARY OF THE INVENTION

The present invention provides solutions to a number of deficiencies in the prior art. It provides a flexible, accurate, and fast method for detecting manufacturing defects on unpopulated printed circuit boards under test (hereinafter referred to as "BUT") utilizing reliable single point current measurement. It eliminates the need for fixturing and up and down movement (Z axis movement) for testing the BUT. It makes it possible to eliminate the need to determine exact test point locations before testing.

The foregoing benefits and others are provided by a tester having, in a first set of preferred embodiments, an AC signal generator connected to a signal plate placed under the BUT for applying an electrical field and thereby generating signals in conductors of the BUT. A large array of pins, more then 128, mounted on an assembly on top of the BUT at fixed intervals, samples currents from the test points on the BUT.

In a second set of preferred embodiments, the AC signal generator is connected to the pin array, and the pins apply signals into the conductive elements of the BUT at fixed intervals. The signal plate detects the electrical field on the BUT.

A signal processing device, a central computer work station, and a test platform onto which the BUT is mounted are preferably part of the test system. The AC test signal source is connected to either the pin array or the signal plate (depending upon the embodiment) to provide signals to induce currents into the BUT. The control unit controls the movement of the pin array assembly (or "PAA") relative to the BUT.

Each movement of the PAA relative to the BUT results in the sampling of multiple test points. A computer controls the whole system by commanding the movement control unit and the PAA selector unit, receiving the measured results and running off-line fault detection and BUT position definition procedures.

Each relative movement of the PAA produces measurements of multiple BUT test points. A complete test of the BUT test points produces a current measurement profile of the entire BUT. The detected signals are proportional to the size and geometry of the sampled conductors. Therefore, a measurement profile from a whole plane of the BUT can be processed to perceive the board's test points. The signal processing extracts relevant features from the profile, which represent the characteristics of the test points. The fault detection system compares each test point's measured characteristics to a known or identical, non-faulty test point on the BUT. The known test point's characteristics can be obtained from a known reference. Such comparisons result in a measure of the difference between the reference and the BUT test points. Preferably, if the difference is larger than a predetermined threshold, the test point is diagnosed to be faulty. If the difference is smaller than the threshold, the test point is diagnosed to be non-faulty. Statistical analysis further results in more detailed information regarding faults found, such as locations, types, etc.

According to one embodiment of the invention, the pin array assembly (PAA) is connected to an AC signal generator, and injects a signal based upon the AC signal into the conductors on the BUT through the pins, preferably one pin at a time, as the PAA moves relative to the BUT. The signal plate detects the electromagnetic field from the BUT conductors.

According to another embodiment of the invention, the BUT is placed on top of a moving conveyor belt with the signal plate either imbedded in the conveyor belt or placed under the conveyor belt. The PAA is stationary. Again, the pin array assembly injects a signal and the signal plate detects the field from the BUT conductors.

According to another embodiment of the invention, The BUT is placed on top of a signal plate and the PAA moves over the BUT. The signal plate is connected to the AC signal generator, and the signal plate radiates an electromagnetic field based on the AC signal onto the BUT. The PAA is sampled one pin at a time to detect the currents from the BUT test points.

According to another embodiment of the invention, the BUT is placed on top of a moving conveyor belt with the signal plate either imbedded in the conveyor belt or placed under the conveyor belt. The PAA is stationary. Again, the signal plate radiates an electromagnetic field based on the AC signal onto the BUT. The PAA is sampled one pin at a time to detect the currents from the BUT test points.

According to another embodiment of the invention, the BUT is placed on top of the signal plate and the PAA moves over the BUT. Again the signal plate radiates an electromagnetic field based on the AC signal onto the BUT. Multiple pins of the PAA are simultaneously or sequentially sampled to detect the currents from the BUT test points.

In a first set of embodiments, an AC source provides a signal to the PAA pins, which in turn contact the conductive elements on the BUT. The conductive elements radiate an electromagnetic field that induces currents on the plate. The currents picked up by the plate electronics are a representation of the conductive elements' size and geometry. High bandwidth amplifiers are used by the electronics to generate low impedance at the plate, to provide a high signal-to-noise ratio (SNR) and the ability to detect the electromagnetic field from the conductive elements on the BUT. Furthermore, a selector is used in conjunction with the high bandwidth amplifiers to improve performance of the design by reducing interference between channels.

In other embodiments, the AC source provides a test signal to the signal plate, which in turn radiates an electromagnetic field based on the test signal onto the BUT. The electromagnetic field induces currents on the BUT's conducting traces. The pins of the array assembly contact the conductive traces to detect the currents from the BUT. The currents picked up by the pin array electronics are a representation of the conductive traces' size and geometry. A high bandwidth amplifier is used by the electronics to generate low impedance at the pins to provide good isolation between adjacent array pins, a high SNR, and the ability to detect the currents from the traces on the BUT.

By scanning across the entire surface of the BUT, a signature of the BUT test points is obtained. Manufacturing faults can be detected with the aid of computer analysis. A fault recognition system compares the current patterns of the test points with known or desired patterns of an identical, non-faulty board. Such comparisons result in a measure of the difference between the non-faulty and faulty boards. If the difference is larger than a predetermined threshold the BUT is diagnosed to be faulty, or out of tolerance. If the difference is smaller than the threshold, the BUT is diagnosed to be non-faulty. Statistical analysis can further result in more detailed information of faults found, such as location, type, etc. The so-called "known pattern" of the non-faulty board can be obtained either by testing a non-faulty board in the same way as testing the BUT, or by theoretical calculation according to the design specifications. The design specifications are easily obtained from computer aided design tools that are used to create printed circuit board layouts.

BRIEF DESCRIPTION OF THE DRAWINGS

The advantages and other characteristics of the invention will be better understood by reading the detailed description of the invention to follow, in conjunction with the attached drawings, wherein.

It should be noted that the drawings are not intended to limit the scope of the invention. The invention will herein be described in detail, and it should be understood that the invention covers all modifications, alternatives and equivalents falling within the scope of the invention given by the claims.

DESCRIPTION OF THE PREFERRED EMBODIMENT

Figure 1:
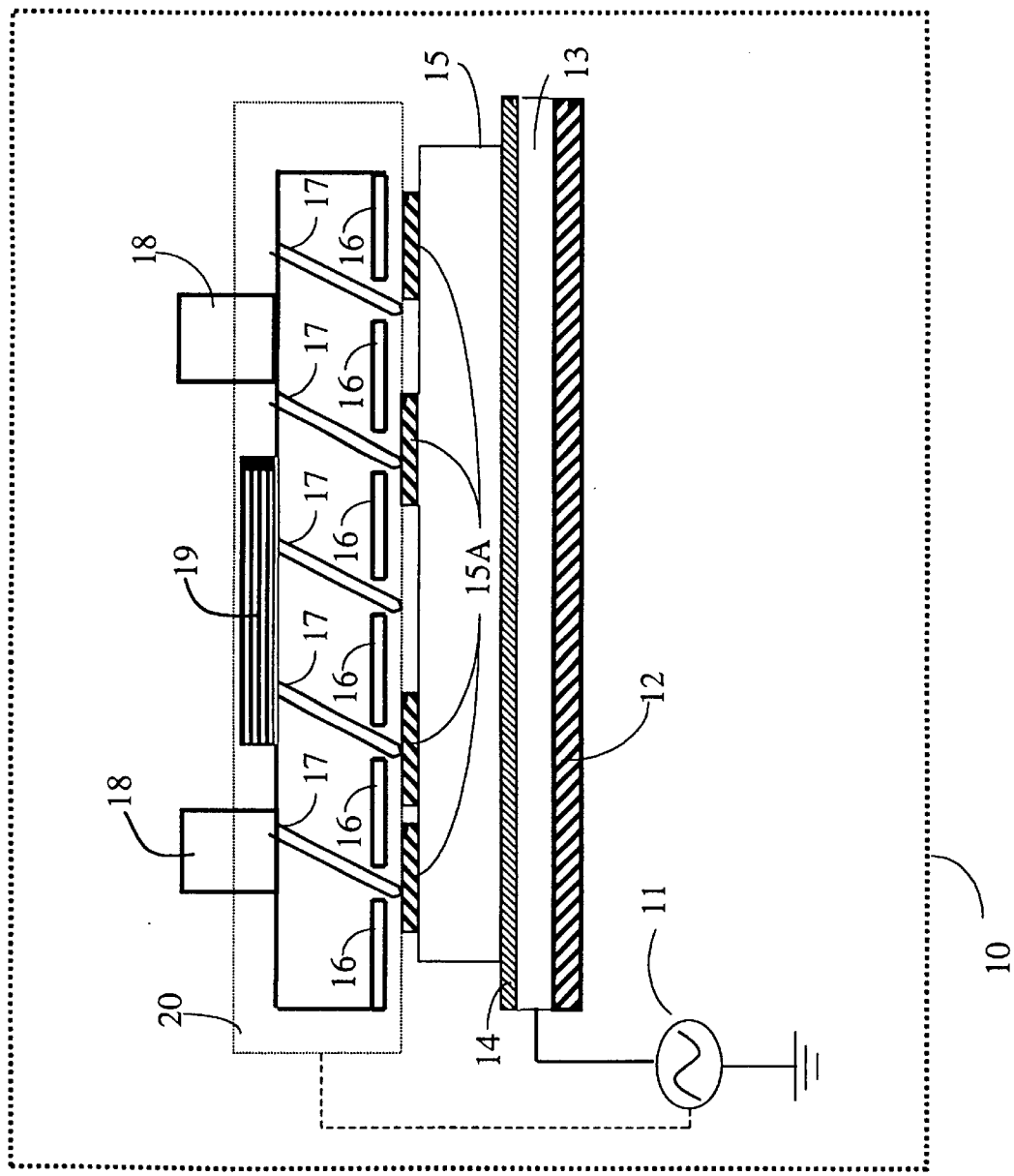
FIG. 1 is a simplified cross-sectional view of the tester according to the invention.

FIG. 1 shows a cross sectional view of pin array tester (PAT) 10. Signal plate 13 resides on nonconductive support plate 12. BUT 15 is placed on insulating surface 14, which provides electrical insulation between signal plate 13 and BUT 15.

Moving mechanism 18 is attached to pin array assembly (PAA) 20, and moves PAA 20 relative to BUT 15, according to control signals from computer 53 (see FIG. 2). Pins 17 are connected to electronics 19 and pass through perforated support plates 16 to contact the BUT's conductive elements 15A.

In a first embodiment, signal plate 13 is supplied with a sinusoidal or other waveform signal from signal generator 11, which causes signal plate 13 to radiate an electromagnetic field into the BUT's conductive elements 15A. The field induces currents and charges on the BUT's conductive elements 15A, which are detected via sampling using pins 17. A digital signal processor (see FIG. 2) processes the sampled signals. The processed signals are then sent to the computer (see FIG. 2) for fault analysis.

In a second embodiment, PAA 20 is connected to signal generator 11, and pins 17 provide currents based upon the AC test signal to conductive test points 15A of BUT 15. Signal plate 13 detects the electromagnetic field generated on BUT 15.

Figure 2A:
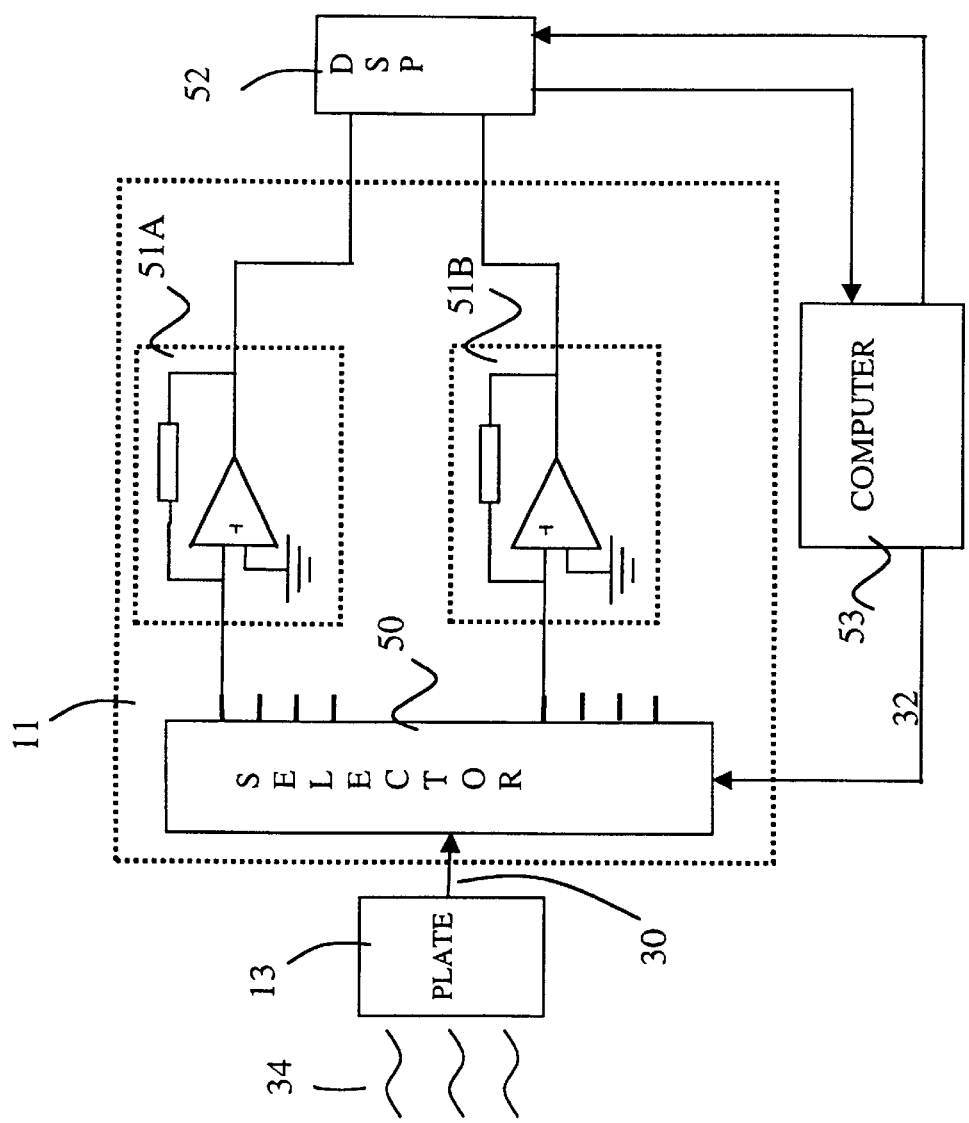
FIG. 2A is a block diagram depiction of the plate assembly electronic interface of FIG. 1 used to detect the electromagnetic field from the conductive traces.

FIG. 2A is a block diagram depiction of electronics 11 associated with plate 13 and used to acquire and process the electromagnetic field picked up by signal plate 13 from the BUT 15 conductive elements 15A in the second embodiment as shown in FIG. 1. Pins 17 of PAA 20 have generated currents in test points 15A of BUT 15. Signal plate 13 detects the resulting electromagnetic field 34, and generates currents 30 based upon field 34. Currents 30 comprise the input signal to electronics 11.

Plate 13 is connected to the input channel of selector 50. Computer 53 controls selector 50 by providing the selector with a sequence selection for amplification units 51. The output channels of selector 50 are connected to amplification units 51, which convert input signals 30 from plate 13 to an amplified signal that is provided to digital signal processor (DSP) unit 52 for signal processing. For example, DSP 52 converts the detected signals into digital data.

Processed signals 32 from the DSP unit 52 are transmitted to computer 53 for storage and analysis. Selector 50 provides isolation between amplification units 51 to prevent signal degradation on large nets.

Figure 2B:
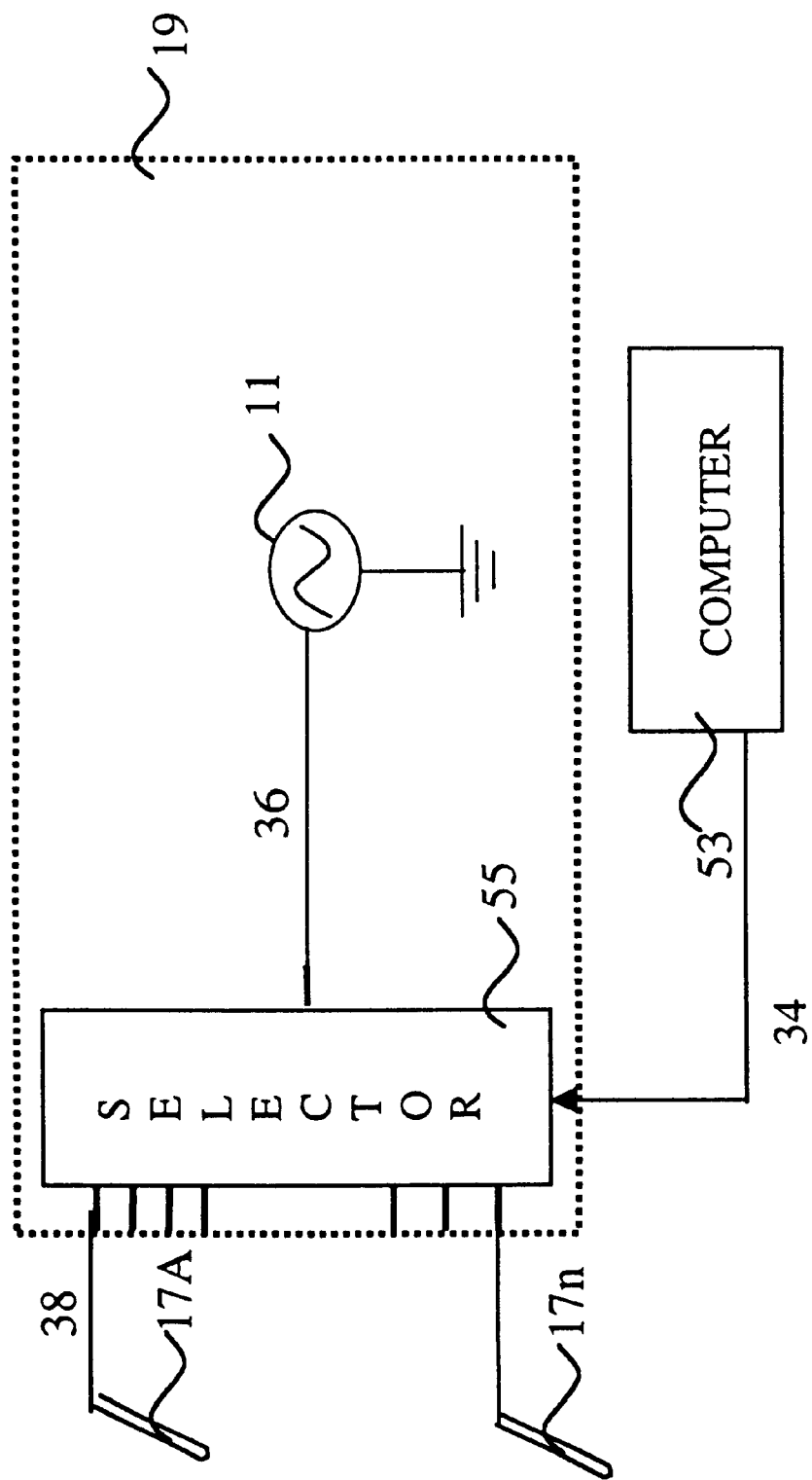
FIG. 2B is a block diagram depiction of the pin array assembly (PAA) electronic interface of FIG. 1 used to inject currents into the conductive traces.

FIG. 2B is a block diagram depiction of electronics 19 in PAA 20 used to apply test signals via pins 17 to BUT 15 conductive elements 15A in the second embodiment as shown in FIG. 1. Input channel 36 of selector 55 carries the AC test signal from AC signal generator 11. Pins 17 are connected to output channels 38 of selector 55. Computer 53 controls selector 55 via control signal 34.

Figure 2C:
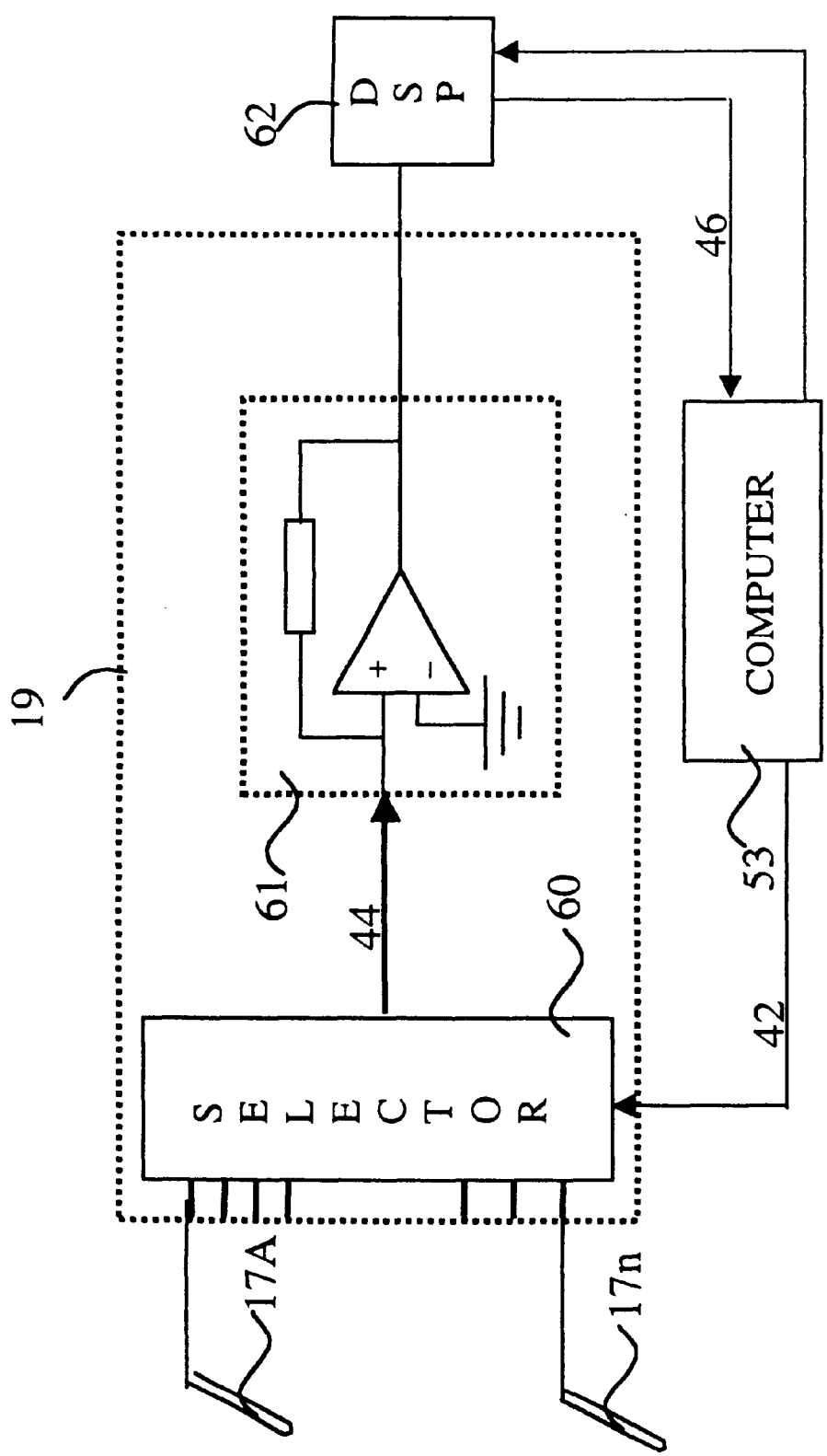
FIG. 2C is a block diagram depiction of the PAA electronic interface of FIG. 1 used to detect signals from the conductive traces.

FIG. 2C is a block diagram depiction of electronics 11 in PAA 20 used to acquire and process the signals picked up by pins 17 from BUT 15 conductive elements in the first embodiment as shown in FIG. 1. Signal plate 13 has generated an electrical field and pins 17 of PAA 20 have detected currents on test points 15A. Pins 17 are connected to the input channels of selector 60. Computer 53 controls selector 60 by providing the selector with a sequence selection for pins 17 via control signal 42.

Output channel 44 of selector 60 is connected to amplification unit 51 that converts the input currents from pins 17 to a signal that is provided to digital signal processor (DSP) unit 62 for signal processing. For example, DSP 62 converts the detected signals into digital data. Processed signals 46 from DSP 62 are transmitted to computer 53 for storage and analysis. Selector 60 provides isolation between input pins 17 to prevent signal degradation on small nets.

Figure 2D:
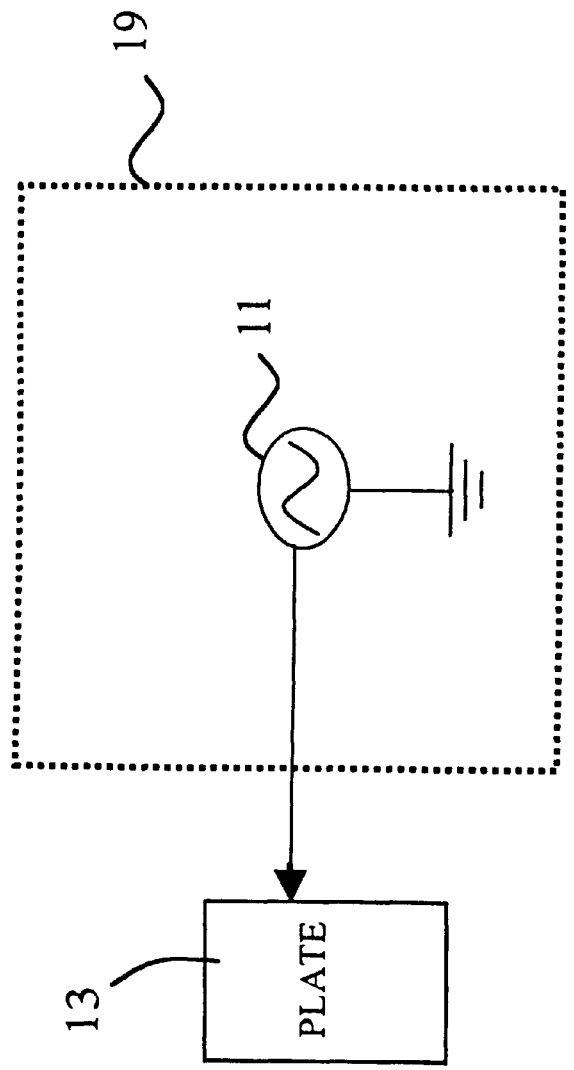
FIG. 2D is a block diagram depiction of the plate assembly electronic interface of FIG. 1 used to apply electromagnetic fields to the traces.

FIG. 2D is a block diagram depiction of electronics 11 associated with plate 13 and used to apply the electromagnetic field generated by signal plate 13 to BUT 15 conductive elements 15A in the first embodiment as shown in FIG. 1.

Figure 3:
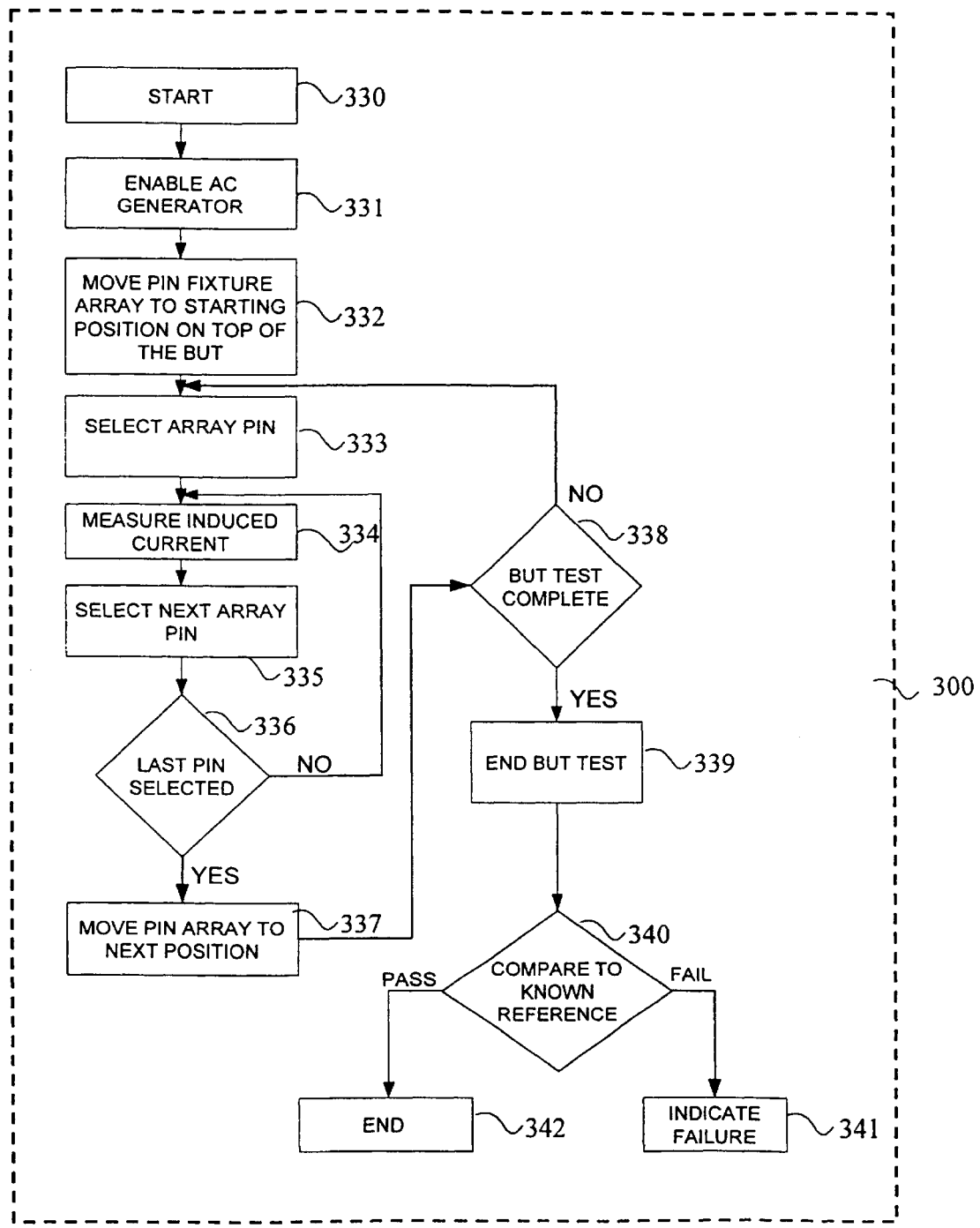
FIG. 3 is a flow chart showing a test method according to the present invention.

FIG. 3 is a flow chart 300 showing a test method program implemented by computer 53. Flow chart 300 illustrates the analysis for both embodiments discussed in FIGS. 2A–2C, where the test signal is injected via PAA 20 and detected via signal plate 13, and where the test signal is injected via signal plate 13 and detected via the PAA 20. In either case, the analysis performed is fundamentally the same.

In step 330, process starts, and computer 53 initializes all PAT parameters. In step 331, computer 53 directs AC generator 11 to provide test signal 36 to either signal plate 13 or PAA 20 (depending upon the embodiment). In step 332, computer 53 sends a move command to moving mechanism 18 and 18A to position PAA 20 relative to BUT 15.

For the embodiments in which PAA 20 applies the test signal, the procedure continues as follows. In step 333, computer 53 sends control signal 32 to selector 50 to select the specific pin(s) 17 to apply the test signal. In step 334, detected signal 30 from plate 13 is amplified by amplification unit 51, processed by DSP 52 and transmitted to computer 53.

For the embodiments in which signal plate 13 applies the test signal, the procedure continues as follows. In step 333, computer 53 sends address control signal 42 to selector 60 to select the specific pin(s) 17 to be sampled. In step 334 the current from the selected pin(s) is amplified by amplification unit(s) 51, processed by DSP 52 and transmitted to computer 53.

In either case, in step 335, computer 53 select the next pin(s) 17 to either apply or detect. In step 336 the selection of pins is examined by computer 53 to check if all pins have been selected for the particular sampling position of BUT 15. If not the next pin(s) are selected. If yes, the pin array assembly is moved to the next sampling position. In step 338, computer 53 checks if the testing of BUT 15 is complete. If not, steps 333 through 338 are repeated for a new position. In step 339, computer 53 ends the test of BUT 15. In step 340, computer 53 analyzes the data from BUT 15. If faults are found, computer 53 indicates failure in step 341. If no fault is found, a pass message is indicated in step 342.

Figure 4:
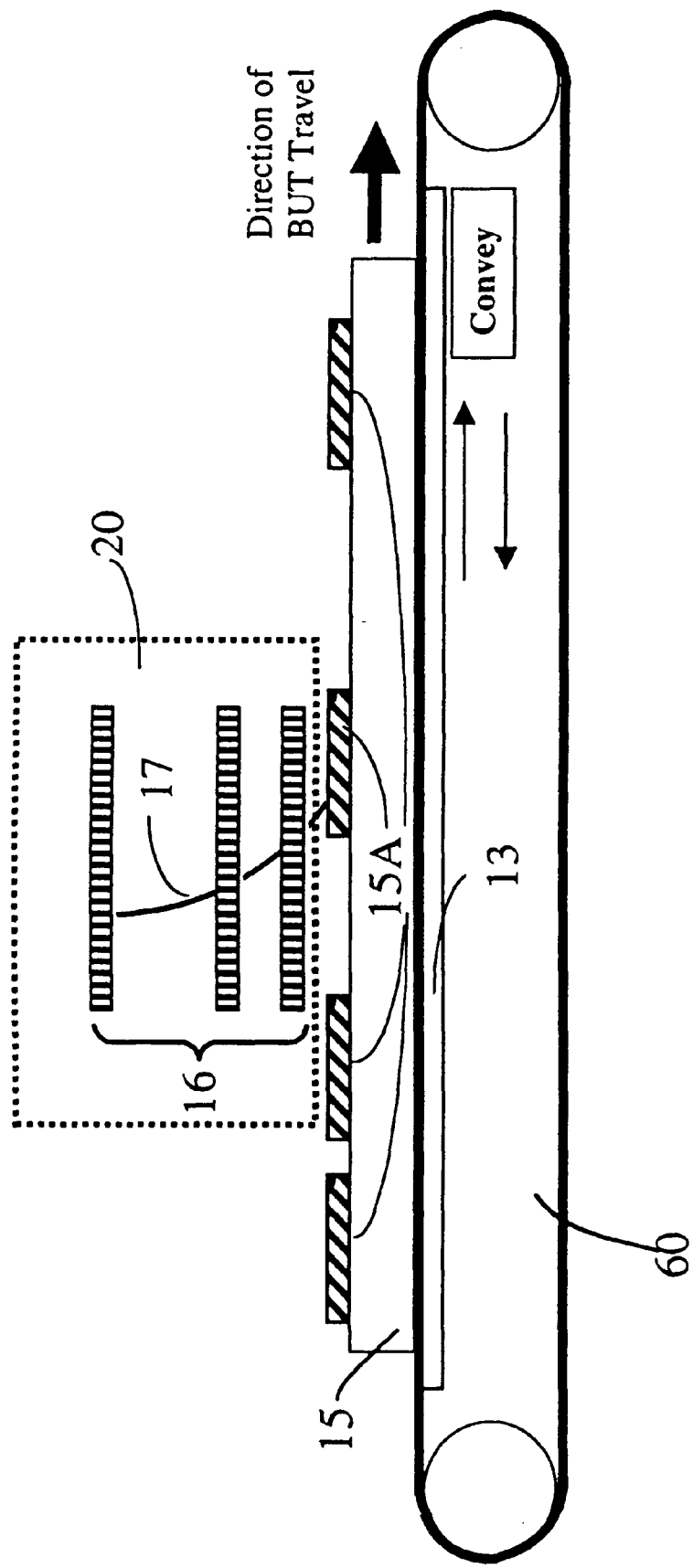
FIG. 4 is a side view of the signal plate that is embedded in a moving conveyer mechanism embodiment or placed under a conveyor belt.

FIG. 4 is a side view of a moving conveyer mechanism 60. BUT 15 is placed on top of conveyer mechanism 60 and is moved relative to PAA 20. Pin(s) 17 of PAA 20 make contact with BUT conductive elements 15A to induce signals or measure the current, depending upon the embodiment.

Figure 5:
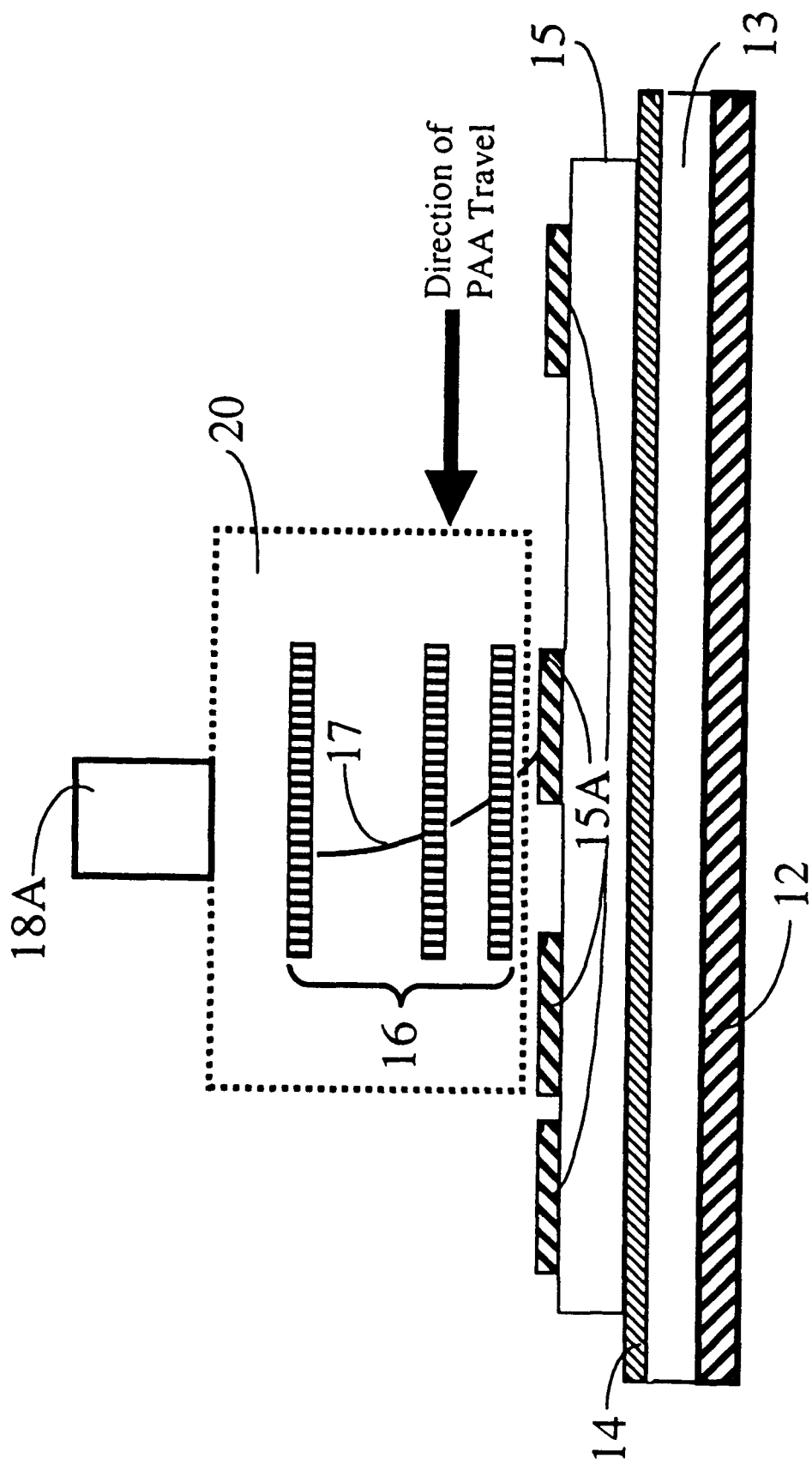
FIG. 5 is a side view of the moving pin array assembly embodiment.

FIG. 5 is a side view of moving PAA 20. Moving mechanism 18A moves PAA 20 over BUT 15. Pin(s) 17 of PAA 20 make contact with BUT traces 15A to induce signals or measure the current, depending upon the embodiment.

Figure 6A:
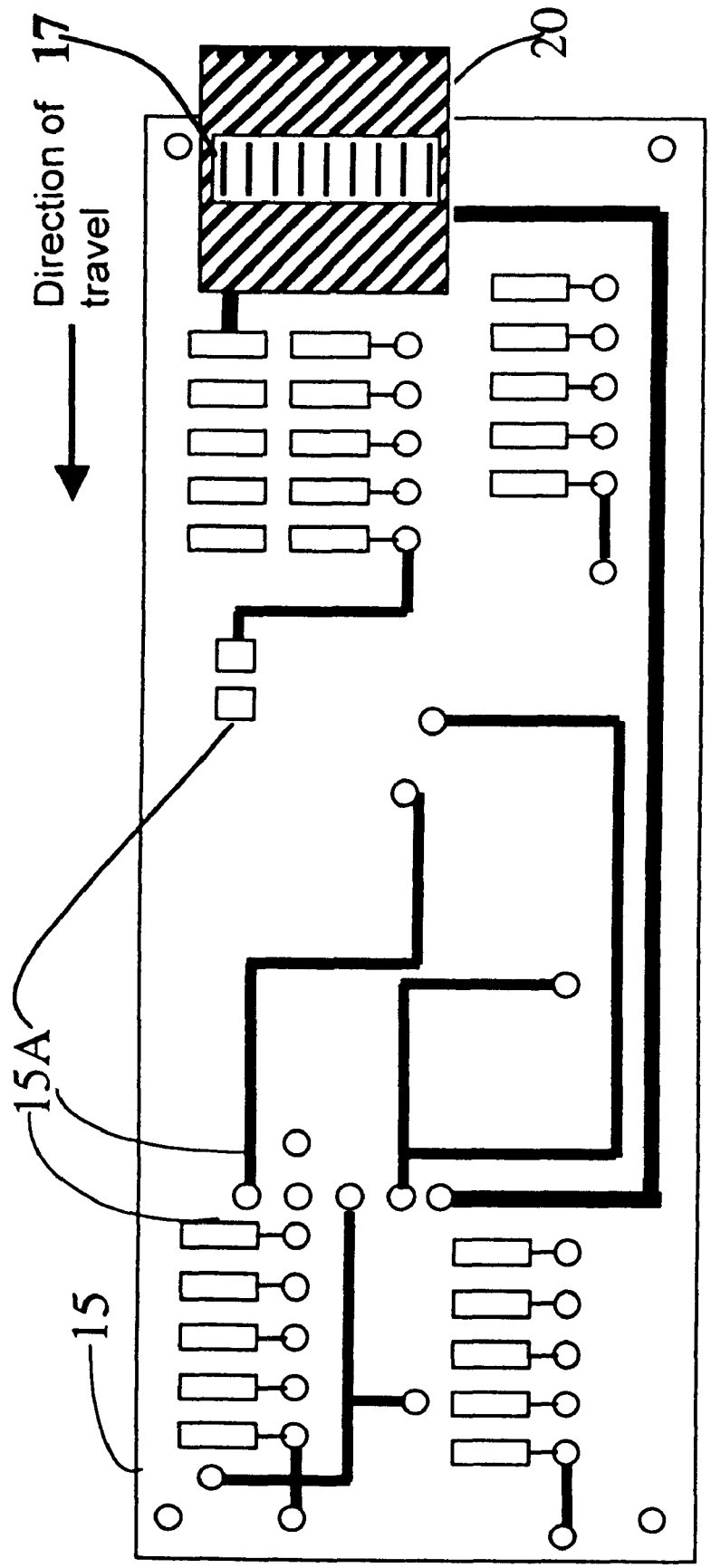
FIGS. 6A and 6B illustrate a top view of the PAA depicting the testing start position and the test intervals of the system according to the invention.
Figure 6B:
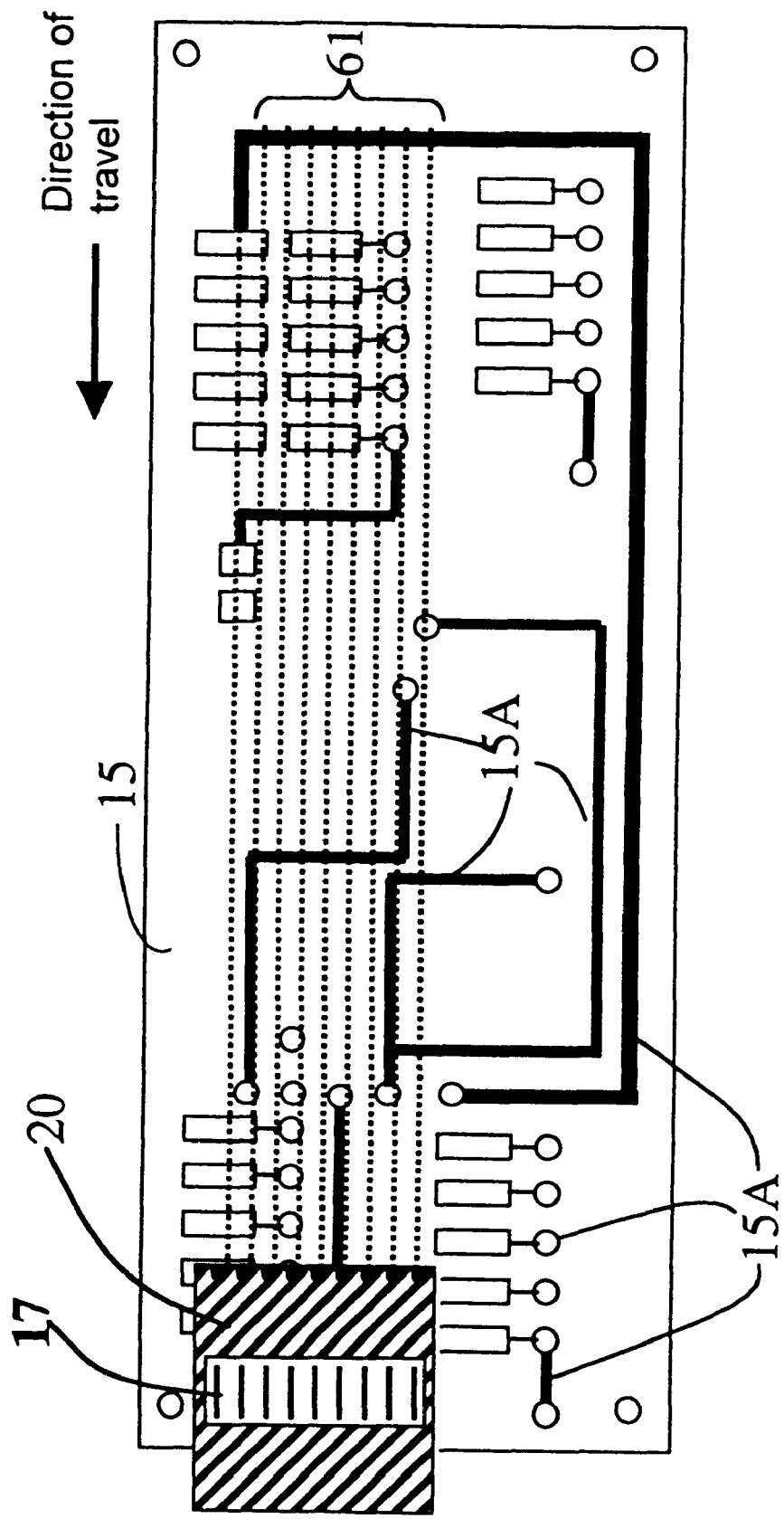

FIGS. 6A and 6B show the position of PAA 20 prior to BUT testing and during the testing process, respectively. In FIG. 6A, PAA 20 is located at a starting position on top of BUT 15 that preferably is void of traces 15A. In FIG. 6B, PAA 20 has moved and is contacting selected traces 15A on BUT 15. Test points 61 indicate where pins 17 have sampled BUT 15 traces 15A during the testing process.

Having presently described the preferred embodiments of the invention, a person skilled in the art would recognize that various alternative embodiments could be constructed within the scope of the invention. For example, various changes may be made in the shape, size, arrangement of parts, and which parts move or are stationary. In particular, the words "above" and "below" have been used in an exemplary manner, but do not indicate any actual required configuration.

What is claimed is:

1. A device for testing an unpopulated printed circuit board under test (BUT) having electrically conductive paths and surfaces whose electrical and physical continuity and conformance to a known standard is to be verified, the device comprising:

a signal plate adjacent to the BUT;

a signal generator for providing an alternating test signal to the signal plate;

wherein the signal plate radiates an electric field onto the BUT according to the test signal, and wherein the electric field induces currents and charges on the BUT's electrically conductive paths and surfaces;

a pin array assembly (PAA) adjacent to the BUT for detecting the signals induced on the BUT's electrically conductive paths and surfaces, wherein each relative movement between the BUT and the PAA produces signal measurements of BUT test points;

a selector to provide isolation between the pins of the array assembly;

a moving mechanism for moving the PAA relative to the BUT;

a digital signal processor for converting the detected signals to digital data;

a computer for controlling the relative pin array assembly movements, sequencing the selector, storing digital data from the digital signal processor, and analyzing the digital data.

2. The apparatus in claim 1 wherein said AC signal generator is one of either amplitude modulated or frequency modulated.

3. The apparatus in claim 1 wherein said PAA comprises a large, one dimensional array spaced in a predetermined configuration.

4. The apparatus of claim 1 wherein said PAA comprises a large two dimensional array spaced in a predetermine configuration.

5. The apparatus of claim 1 wherein the computer includes a work station running software to diagnose faults on the BUT and wherein said computer analysis receives a signal from each test point and measures an analog value of the signal, converts the analog value to digital form, and transfers the digital form to the work station.

6. The apparatus of claim 1 wherein the PAA pins consist of a conductive fiber.

7. The apparatus of claim 1 wherein the PAA and the signal plate are disposed on opposite sides of the BUT.

* * * * *